United States Patent
Schuetz

(10) Patent No.: US 8,587,111 B2
(45) Date of Patent: Nov. 19, 2013

(54) MULTI-CHIP PACKAGE WITH THERMAL FRAME AND METHOD OF ASSEMBLING

(75) Inventor: Roland Schuetz, Ottawa (CA)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 85 days.

(21) Appl. No.: 13/090,427

(22) Filed: Apr. 20, 2011

(65) Prior Publication Data

US 2012/0001314 A1 Jan. 5, 2012

Related U.S. Application Data

(60) Provisional application No. 61/361,472, filed on Jul. 5, 2010.

(51) Int. Cl.
*H01L 23/34* (2006.01)
(52) U.S. Cl.
USPC .................................. 257/690; 257/686
(58) Field of Classification Search
USPC .................... 257/690, E23.08, 686
See application file for complete search history.

(56) References Cited

U.S. PATENT DOCUMENTS

| | | | |
|---|---|---|---|
| 5,861,666 A | 1/1999 | Bellaar | |
| 7,520,781 B2 | 4/2009 | Clayton et al. | |
| 2004/0253762 A1 | 12/2004 | Lee | |
| 2006/0138628 A1* | 6/2006 | Tzu | 257/686 |
| 2006/0249827 A1 | 11/2006 | Fasano et al. | |
| 2006/0286717 A1 | 12/2006 | Solberg et al. | |
| 2007/0278648 A1* | 12/2007 | Akram | 257/686 |
| 2008/0001283 A1* | 1/2008 | Lee et al. | 257/712 |
| 2008/0048309 A1 | 2/2008 | Corisis et al. | |
| 2010/0046183 A1 | 2/2010 | Park et al. | |

* cited by examiner

*Primary Examiner* — Tran Tran
(74) *Attorney, Agent, or Firm* — Harvey Auerback

(57) ABSTRACT

A semiconductor device includes a substrate having a plurality of substrate bonding pads disposed on a bonding surface thereof. A plurality of semiconductor dice are stacked on the bonding surface of the substrate to form a die stack. Each die has a plurality of die bonding pads arranged along at least one bonding edge thereof. The remaining edges of each die are non-bonding edges. A plurality of bonding wires each electrically connects one of the die bonding pads to one of the substrate bonding pads. At least one thermally conductive layer is disposed between two adjacent semiconductor dice. At least one thermally conductive lateral portion is in thermal contact with the at least one layer of thermally conductive material. Each thermally conductive lateral portion is arranged along a non-bonding edge of the die stack.

16 Claims, 12 Drawing Sheets

MULTI-CHIP PACKAGE WITH THERMAL FRAME AND METHOD OF ASSEMBLING

RELATED APPLICATION

This application claims priority to U.S. Provisional Application Ser. No. 61/361,472, which is incorporated by reference herein in its entirety.

FIELD OF THE INVENTION

The invention relates generally to semiconductor memory devices, and more specifically to multi-chip packages.

BACKGROUND

The use of semiconductor integrated circuit chips for data storage, such as portable flash memory cards, is widespread. Users of these devices desire ever-increasing data storage capacity, and manufacturers strive to provide a large storage capacity in a cost-effective manner.

It is known to achieve an increased memory density within a single package by stacking multiple semiconductor chips or dice in a single package, known as a Multi-Chip Package (MCP). The increased number of dice provides a corresponding increase in storage capacity relative to a single die. Referring to FIG. 1, the MCP 100 consists of four NAND Flash memory dice 102. It should be understood that this method is equally applicable to other memory devices. Each die 102 has bonding pads 104 that are electrically connected via bonding wires 106 to a common substrate 108. Although the dice 102 are shown with bonding pads 104 on two opposite sides, it should be understood that each die 102 may alternatively have a different arrangement of bonding pads 104, for example on a single side, or on two adjacent sides, or any other arrangement. The substrate 108 provides further electrical connections from the bonding wires 106 to solder balls 110 on the opposite side of the substrate 108, forming a Ball Grid Array (BGA) for connection to an external device (not shown). An interposer 112 is provided between each pair of consecutive dice 102, to create a sufficient clearance therebetween to allow the attachment of the bonding wires 106 to the bonding pads 104.

Another approach is shown in FIG. 2. The MCP 200 consists of four NAND Flash memory dice 202 with bonding pads 204 along one side. The dice 202 are laterally offset from one another to expose the bonding pads 204 of each die 202. In this arrangement, all of the dice 202 can be stacked in a single step, and thereafter all of the bonding wires 206 can be attached in a single step by a wire bonding machine (not shown). This arrangement does not require interposers to provide access to the bonding pads 204, resulting in a more compact arrangement. This arrangement may alternatively be used with dice 202 having bonding pads 204 along two adjacent sides, in which case the dice would be laterally offset in two dimensions.

In these and other arrangements, each die consumes power during operation, which is dissipated as heat. An accumulation of heat within the stack can cause reduced operating efficiency, or even failure of the device. A number of manufacturing trends that provide increased performance or capacity also tend to generate more heat in a smaller volume, such as an increased number of dice, decreased die thickness, decreased feature size, and increased clock speed. Therefore, it is increasingly important to discharge the heat from within the stack to the environment.

One approach is to provide a thermally conductive heat sink with a planar surface in thermal contact with a top or bottom die of the stack. The heat from the stack is conducted into the heat sink, and from there to the environment. This approach provides cooling for the top or bottom surface of the stack. However, cooling the middle layers of the stack remains a problem because the middle layers are farther from the surface heat sink and surrounded by other heat-generating dice.

Another approach is to provide each die in a dielectric carrier, as shown in U.S. Pat. No. 5,600,541. The dielectric carrier permits stacking of the dice and allows electrical connections to be made by wires or vias running through the dielectric, but may contribute significantly to the overall thickness of the stack. In addition, the electrical connections to the die may increase the expense and complexity of assembly, and even the most thermally-conductive dielectric materials are somewhat limited in their capacity to dissipate heat, which may not be sufficient for some applications.

Still another approach is to provide an active cooling system, such as by circulating a liquid coolant around or through the die stack, for example through vias. However, if the active cooling system fails the device is also likely to fail, particularly since actively-cooled systems are generally not equipped to passively dissipate a sufficient amount of heat.

Therefore, there is a need for a Multi-Chip Package having improved heat dissipation.

There is also a need for a Multi-Chip Package having a compact arrangement.

There is also a need for a Multi-Chip Package that is simple to manufacture.

SUMMARY

It is an object of the present invention to address one or more of the disadvantages of the prior art.

It is another object of the present invention to provide a Multi-Chip Package having a metallic thermal frame for providing improved heat dissipation.

It is another object of the present invention to provide a Multi-Chip Package having a thermal frame formed by alternately stacking semiconductor dice and thermal frame components.

It is another object of the present invention to provide a Multi-Chip Package having a thermal frame wherein the dice are wire bonded to the substrate.

In one aspect, a semiconductor device comprises a substrate having a plurality of substrate bonding pads disposed on a bonding surface thereof. A plurality of semiconductor dice are stacked on the bonding surface of the substrate to form a die stack. Each die has a plurality of die bonding pads arranged along at least one bonding edge thereof. The remaining edges of each die are non-bonding edges. The device includes a plurality of bonding wires. Each bonding wire electrically connects one of the die bonding pads to one of the substrate bonding pads. The device includes at least one thermally conductive layer. Each thermally conductive layer is disposed between two adjacent semiconductor dice. At least one thermally conductive lateral portion is in thermal contact with the at least one layer of thermally conductive material. Each thermally conductive lateral portion is arranged along a non-bonding edge of the die stack.

In a further aspect, the thermally conductive layer and the thermally conductive lateral portion are composed primarily of an electrically conductive material. The device further comprises a dielectric layer disposed between the at least one thermally conductive layer and the two adjacent semiconductor dice to provide electrical isolation therebetween.

In a further aspect, the electrically conductive material is one of a metal and a metallic alloy.

In a further aspect, the dielectric layer is a dielectric coating on the thermally conductive layer.

In a further aspect, the substrate is in thermal contact with the at least one lateral portion.

In a further aspect, a thermally conductive top layer is disposed on an uppermost die of the stack. The thermally conductive top layer is in thermal contact with the at least one lateral portion.

In a further aspect, the top layer comprises a heat sink portion for dissipating heat generated by the device during operation.

In a further aspect, the substrate is in thermal contact with the at least one lateral portion. The substrate further comprises a heat sink portion for dissipating heat generated by the device during operation.

In a further aspect, the at least one thermally conductive layer is a plurality of thermally conductive layers.

In a further aspect, each die is adjacent to a thermally conductive layer.

In a further aspect, every pair of adjacent dice has a thermally conductive layer disposed therebetween.

In a further aspect, a first one of the plurality of thermally conductive layers is thicker than a second one of the plurality of thermally conductive layers.

In a further aspect, the first one of the plurality of thermally conductive layers is closer to a center of the stack than the second one of the plurality of thermally conductive layers.

In a further aspect, each of the thermally conductive layers has at least one end portion extending beyond a non-bonding edge of the dice. Each lateral portion is formed at least in part by at least one end portion of the thermally conductive layers.

In a further aspect, each lateral portion includes a thermally conductive resin disposed between the end portions of the thermally conductive layers.

In a further aspect, each lateral portion is assembled at least in part by welding the end portions of the thermally conductive layers.

Additional and/or alternative features, aspects, and advantages of embodiments of the present invention will become apparent from the following description, and the accompanying drawings.

DETAILED DESCRIPTION

Figure 3:
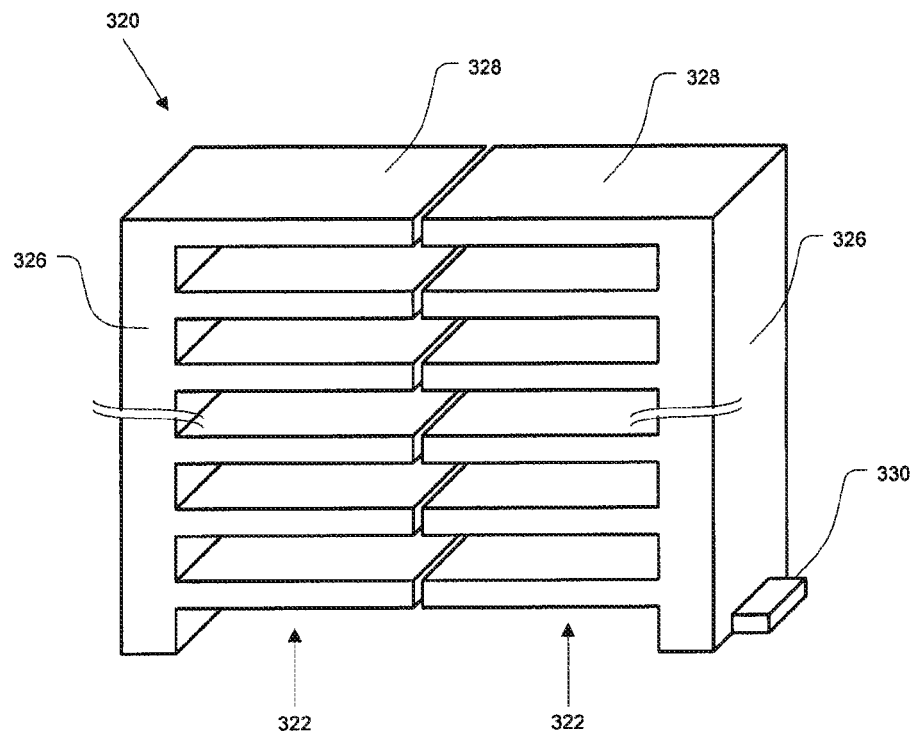
FIG. 3 is a perspective view of a thermal frame according to a first embodiment.
Figure 4:
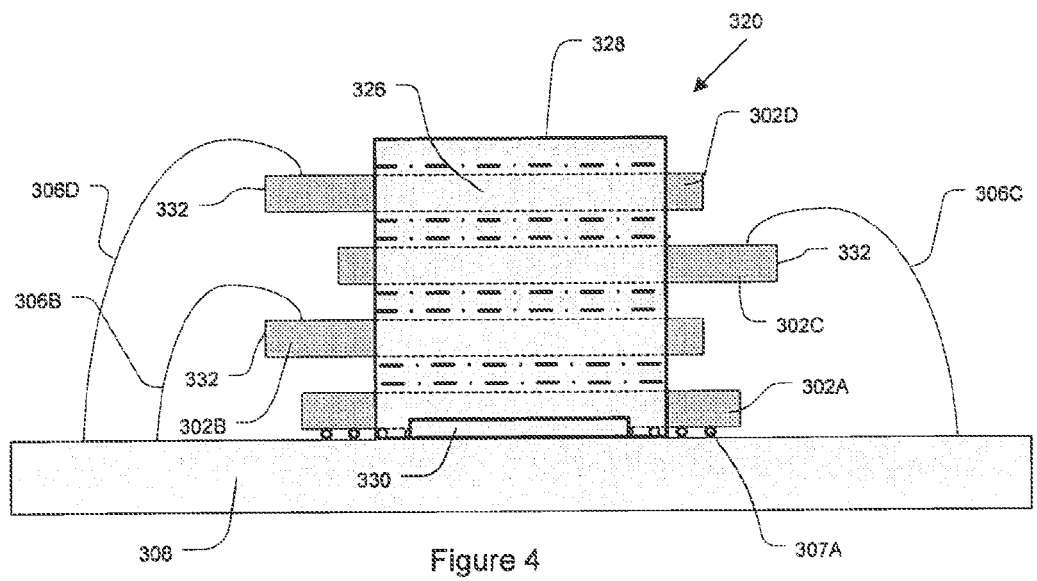
FIG. 4 is a first side elevation view of a Multi-Chip Package (MCP) with the thermal frame of FIG. 3.
Figure 5:
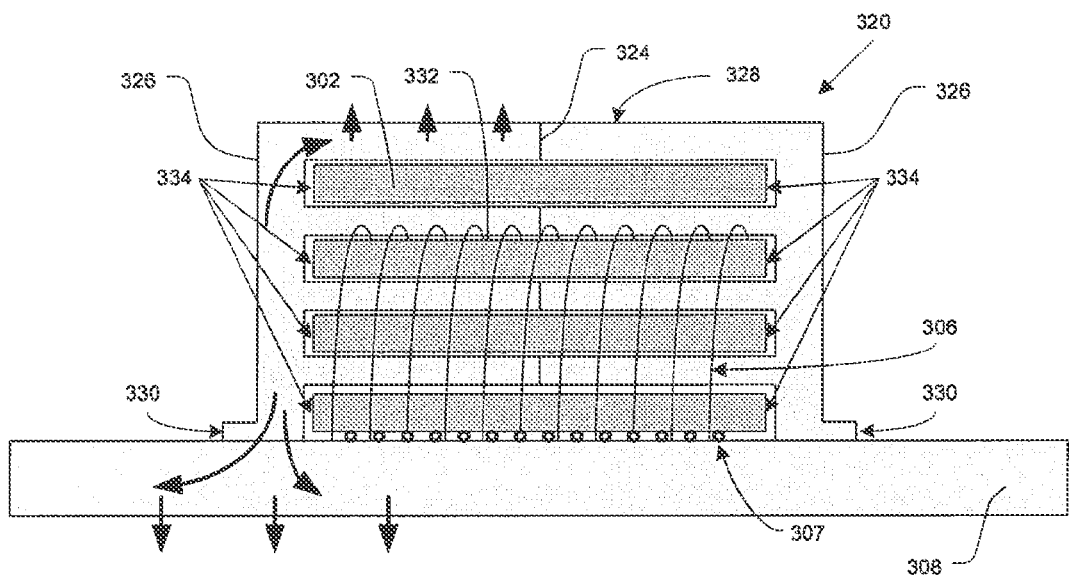
FIG. 5 is a second side elevation view of the Multi-Chip Package (MCP) of FIG. 4.
Figure 6:
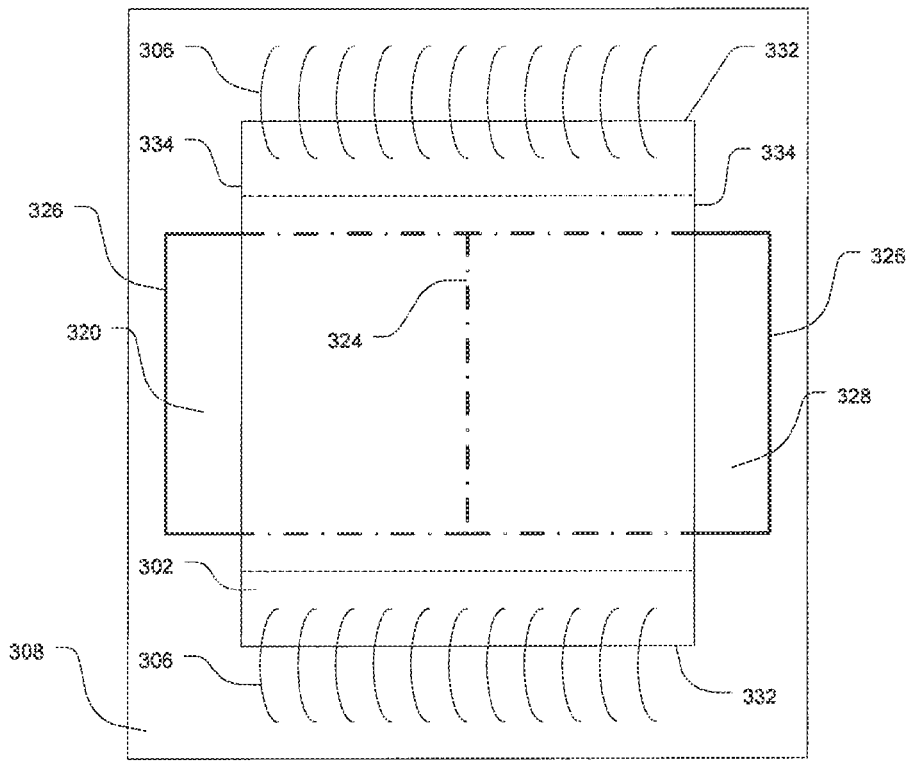
FIG. 6 is a schematic top view of the Multi-Chip Package (MCP) of FIG. 4.

Referring to FIGS. 3-6, a thermal frame 320 will be described according to a first embodiment. FIG. 3 shows a thermal frame 320 with plates 322 that extend in between the dice 302 (best seen in FIG. 5) and into the die stack 300. Referring to FIGS. 3, 5, and 6, the frame 320 can be split along a vertical plane 324 to allow a semiconductor die 302 to be received in each recess between two neighboring plates 322, such that every pair of adjacent dice 302 has a thermally conductive layer therebetween. It is contemplated that more than one die 302 might alternatively be received in any or all of the recesses between plates 322, depending on the heat dissipation requirements of the particular application. It should be understood that any number of dice 302 may be used, by providing the frame 320 with recesses of the appropriate size and number. It is contemplated that two or more dice 302 disposed in the same recess may be connected to each other using bumps or vias (not shown). The frame 320 is made of a thermally conductive material, which may also be an electrically conductive material, for example a metal such as aluminum or a metallic alloy. It is contemplated that the plates 322 may be comparable in thickness to the dice 302, but the thickness may vary according to the desired degree of heat dissipation. A suitable electrical insulator, such as a thermally conductive dielectric resin, may be provided between each die 302 and the adjacent plates 322 to prevent electrical contact between the die 302 and the frame 320, particularly when an electrically conductive material is used for the frame 320.

Figure 1:
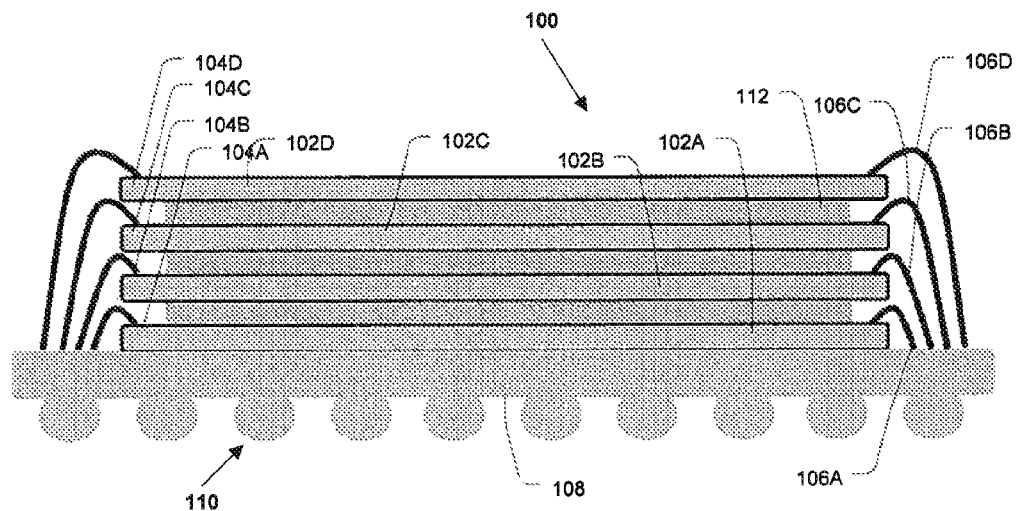
FIG. 1 is a schematic cross-sectional view of a Multi-Chip Package (MCP) according to a first prior art embodiment.
Figure 2:
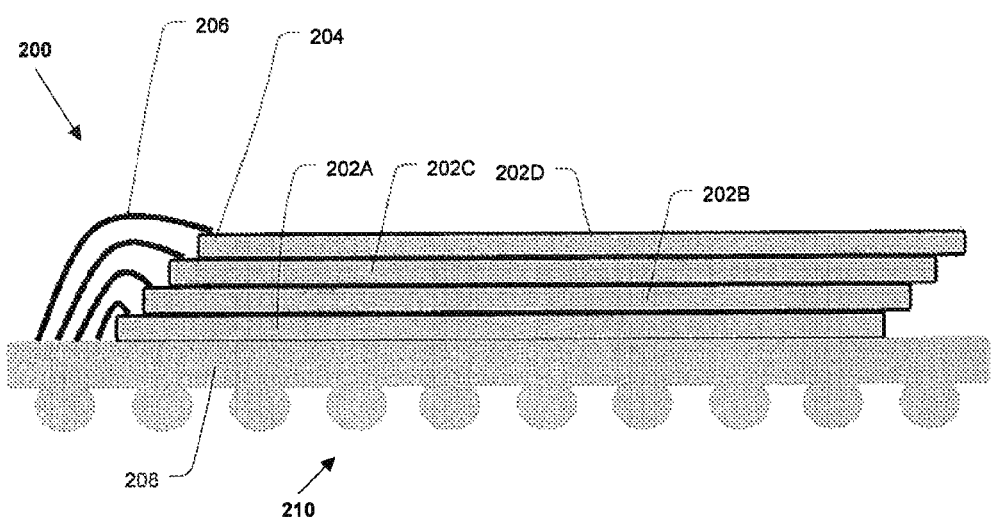
FIG. 2 is a schematic cross-sectional view of a Multi-Chip Package (MCP) according to a second prior art embodiment.

The plates 322 may alternatively be coated with a dielectric layer prior to assembly. The dielectric coating is preferably thin, such that the frame 210 is composed primarily of the electrically and thermally conductive material for the purposes of heat dissipation. The frame 320 provides a thermally conductive path for the plates 322 to conduct heat from within the die stack 300 outwardly toward the relatively cooler lateral portions 326 of the frame 320, from which the heat is further conducted to the top surface 328 and to the package substrate 308, as shown by the arrows in FIG. 5. One or more of the outer surfaces may be provided with conventional external heat sinks (not shown) to help dissipate the heat to the environment. Bonding tabs 330 (FIGS. 3, 4, 5) are optionally provided at the base of the frame 320, and can be used to bond the frame 320 to the package substrate 308 to provide a stronger mechanical connection and an enhanced thermal contact to the substrate 308. The bonding tabs 308 may alternatively be omitted (FIGS. 3, 6) which may result in a simpler or less expensive manufacture. Referring to FIGS. 4, 5 and 6, the lateral portions 326 are arranged along non-bonding edges 334 of the die stack such that the bonding edges 332 of each die 302 protrude from the end of the frame, to allow bonding wires to be attached to bonding pads located along the edge of each die. It is contemplated that the dice 302 may alternatively protrude on only a single side if the bonding wires 306 are bonded to the dice 302 only on that side, for example in an arrangement similar to FIG. 2. The bottom die 302A may be electrically connected to the substrate by solder bumps 307A instead of, or in addition to, bonding wires 306A. It is contemplated that the bonding wires 306 may be attached to each die 302 after it is stacked, or alternatively that the dice 302 may be stacked in such a way that all of the bonding wires 306 can be added in a single manufacturing step after all the dice 302 have been stacked, for example in an arrangement similar to FIG. 2.

Figure 7:
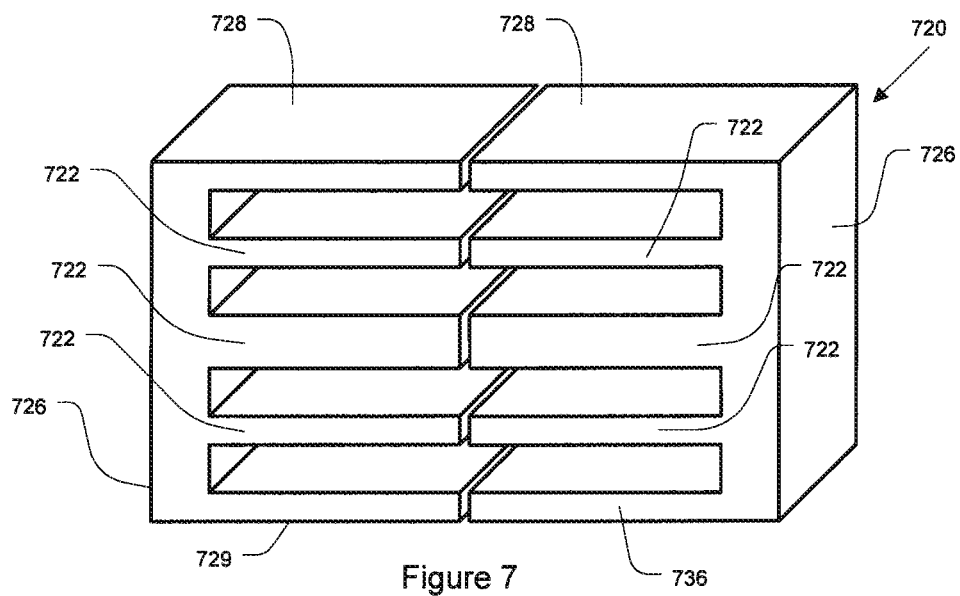
FIG. 7 is a perspective view of a thermal frame according to a second embodiment.

Referring to FIG. 7, a thermal frame 720 will be described according to a second embodiment. The frame 720 is similar in some respects to the frame 320 of FIG. 3, and some of the features common to both embodiments have been given similar reference numbers and will not be described again in detail. The added bottom plate 736 provides a bottom surface 729 which has a larger thermal contact area between the frame 720 and the substrate (not shown in this embodiment), and allows a stronger mechanical connection to the substrate. In this embodiment, all of the dice (not shown) including the bottom die may be wire bonded to the substrate. In addition, the plates 722 have non-uniform thickness. It is contemplated that relatively thicker plates may 722 be used to provide greater heat dissipation in parts of the stack where more heat dissipation is desired, such as nearer the middle of the stack or adjacent dice that are expected to produce more heat, and relatively thinner plates 722 may be used in other positions to provide a more compact arrangement. It is further contemplated that the top 728 and/or bottom 736 of the frame 720 could vary in thickness depending on the desired amount of heat dissipation.

Figure 9:
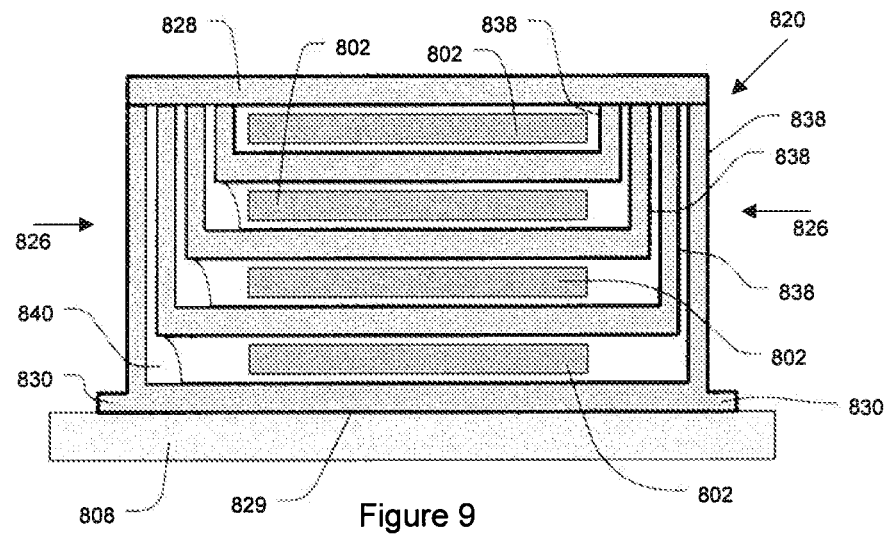
FIG. 9 is a schematic cross-sectional view of the Multi-Chip Package (MCP) with a thermal frame of FIG. 8 according to an alternative embodiment.
Figure 8:
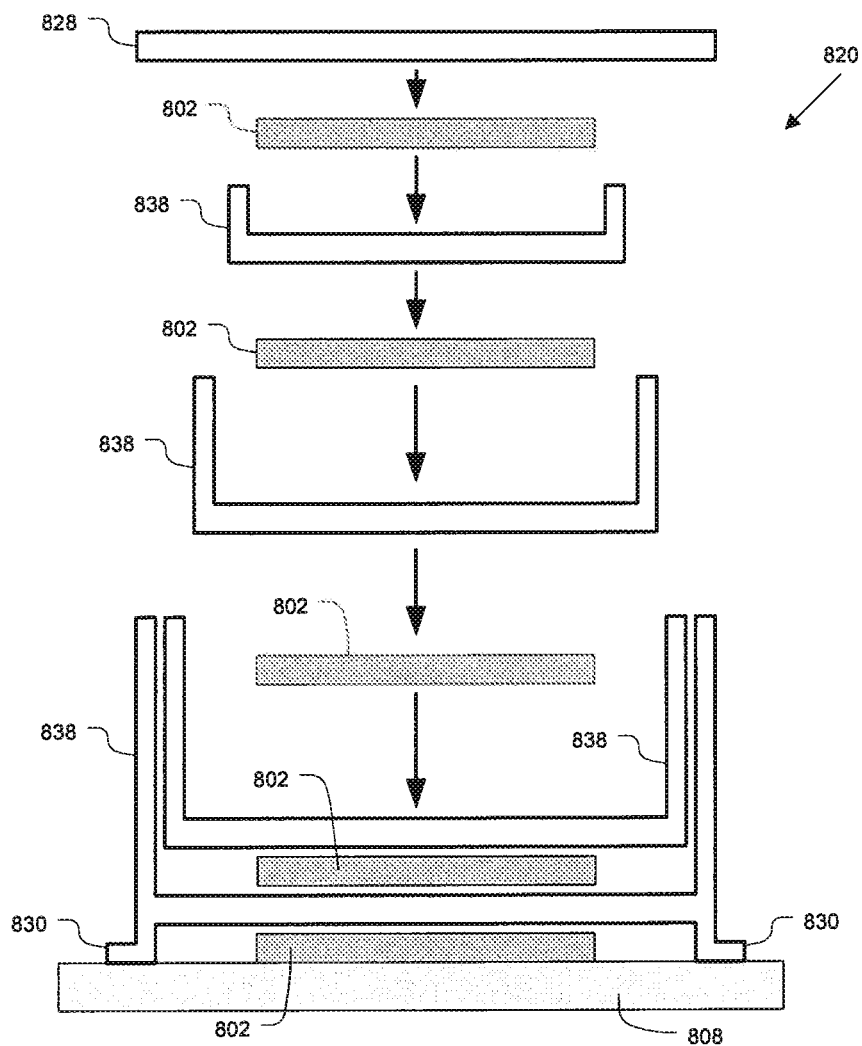
FIG. 8 is a schematic exploded view of a Multi-Chip Package (MCP) with a thermal frame according to a third embodiment.
Figure 10:
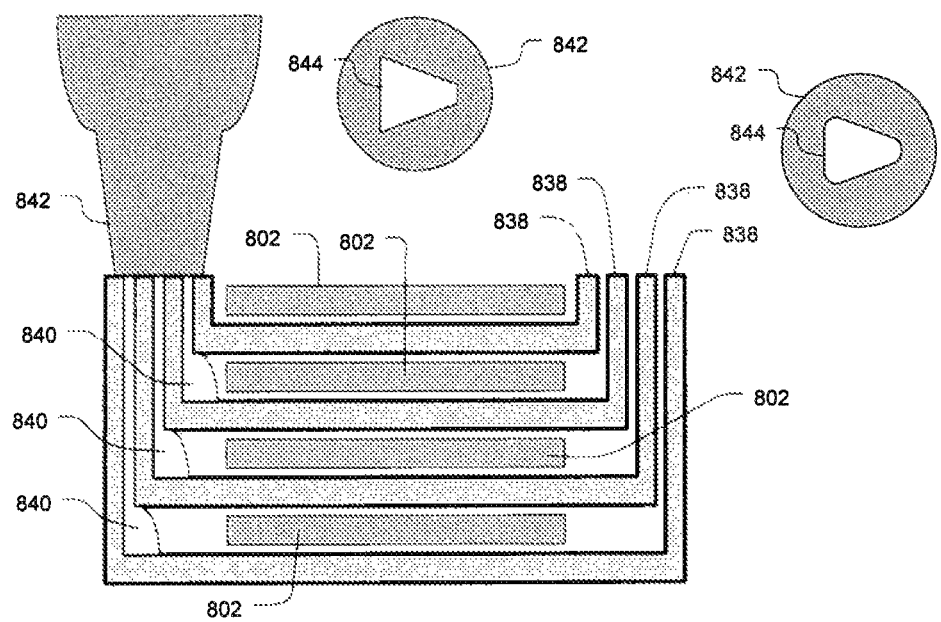
FIG. 10 is a schematic cross-sectional view of the Multi-Chip Package (MCP) with a thermal frame of FIG. 8, showing the addition of a resin.

Referring to FIGS. 8 and 9, a thermal frame 820 will be described according to a third embodiment. The frame 820 is similar in some respects to the frames of previously described embodiments, and some of the common features have been given similar reference numbers and will not be described again in detail. The thermal frame 820 is formed using a series of nested channel-shaped members 838, each having a recess dimensioned to receive one or more dice 802. If two or more adjacent dice 802 are received in the same channel-shaped member 838, they may be interconnected using bumps or vias (not shown). The thermal frame 820 may be assembled by alternately stacking dice 802 and channel-shaped members 838 of appropriate dimensions. When the desired number of dice 802 has been reached, a cap member is placed on top of the stack 800 to form the top portion 828, preferably in thermal contact with the top edges of the channel-shaped members 838. The cap member may also be in thermal contact with the uppermost die 802 of the stack 800. A number of alternative structures of the channel-shaped members 838 are contemplated. The lowermost member 838 may have a bottom surface 829 in contact with the substrate 808 (FIG. 9), or alternatively may have a recessed lower portion (FIG. 8) to provide clearance for a lowermost die 802 that is connected directly to the substrate 802 by solder bumps, bonding wires, or any other suitable method. Bonding tabs 830 are shown in FIGS. 8 and 9, similar to those shown in the embodiment of FIG. 3, but it is contemplated that the bonding tabs 830 may alternatively be omitted. The channel-shaped members 838 may be dimensioned such that each pair of consecutive channel-shaped members 838 forms a friction fit between their lateral portions to form a thermal contact along the lateral portion 826 of the frame 820, or they may alternatively be dimensioned to provide a clearance or gap therebetween which may optionally be filled with a thermally-conductive dielectric resin 840 prior to attaching the cap member. One method of filling the clearance or gap with resin 840 using an injector 842 having a tapered aperture 844 is shown in FIG. 10. The tapered aperture 844 has a wider end to provide more resin 840 in the deeper gaps and a narrower end to provide less resin 840 in the shallower gaps, resulting in a more even fill.

Figure 11:
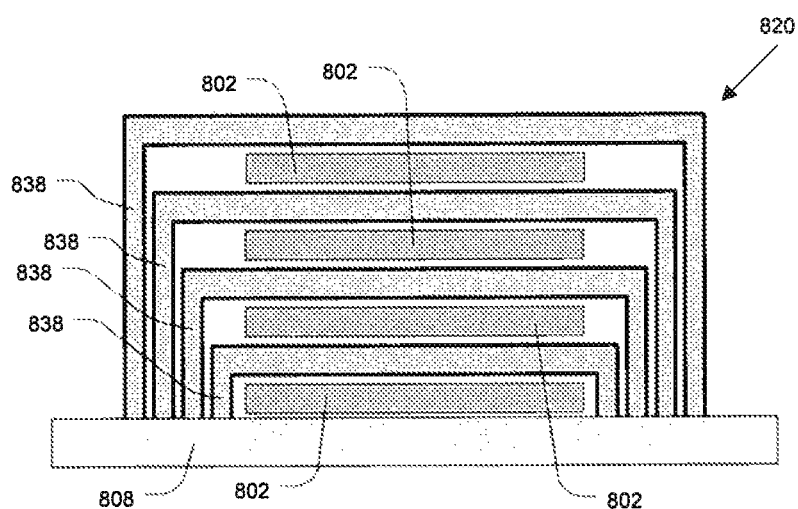
FIG. 11 is a schematic cross-sectional view of the Multi-Chip Package (MCP) with a thermal frame of FIG. 8, according to an alternative embodiment.
Figure 12:
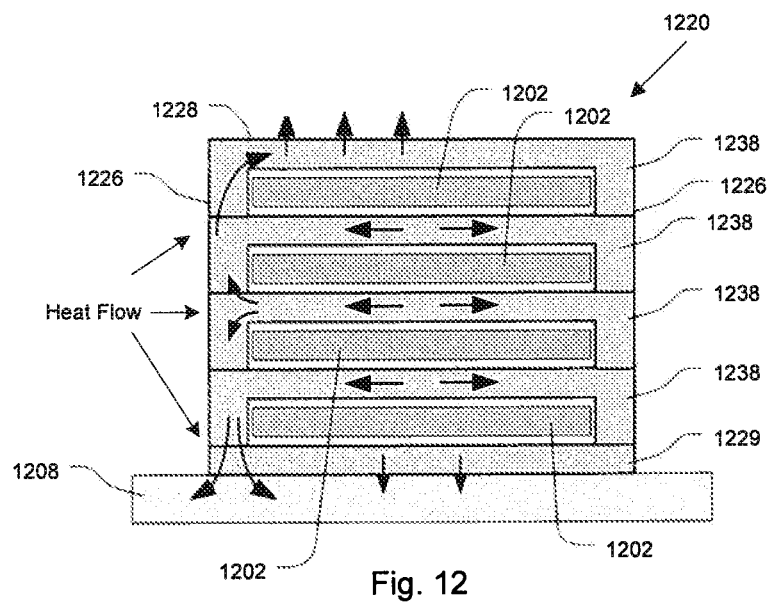
FIG. 12 is a schematic cross-sectional view of a Multi-Chip Package (MCP) with a thermal frame according to a fourth embodiment.
Figure 13:
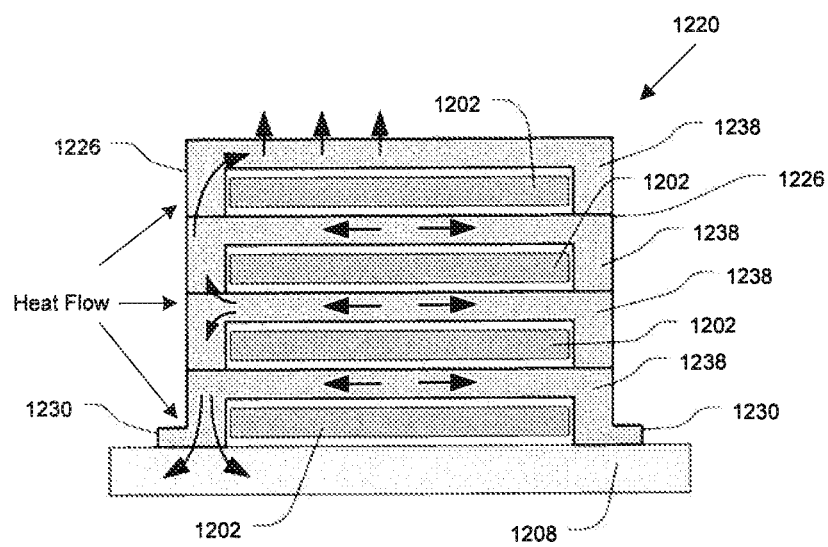
FIG. 13 is a schematic cross-sectional view of the Multi-Chip Package (MCP) with a thermal frame of FIG. 12, according to an alternative embodiment.

Referring still to FIGS. 8 and 9, the channel-shaped members 838 may additionally or alternatively be welded together to form a mechanical and thermal connection therebetween. The horizontal portions of the channel-shaped members 838 preferably form a planar thermal contact with the adjacent dice 802, for example via a thermally-conductive dielectric resin. The depth of each channel-shaped member 838 may be dimensioned such that when the stack is completed the top edges of all the channel-shaped members 838 are substantially coplanar and form a thermal contact with the cap member 828. The top edges may alternatively be trimmed to a uniform length after stacking but before attaching the top member 828 to ensure good mechanical and thermal contact therebetween. The cap member 828 may be bonded to the channel-shaped members 838 by any suitable method, for example using a thermally-conductive dielectric resin or by welding. Referring to FIG. 11, in an alternative embodiment, the channel-shaped portions 838 are inverted so that the channel-shaped opening is oriented toward the substrate 808. In this embodiment, a separate cap member would not be required.

Figure 14:
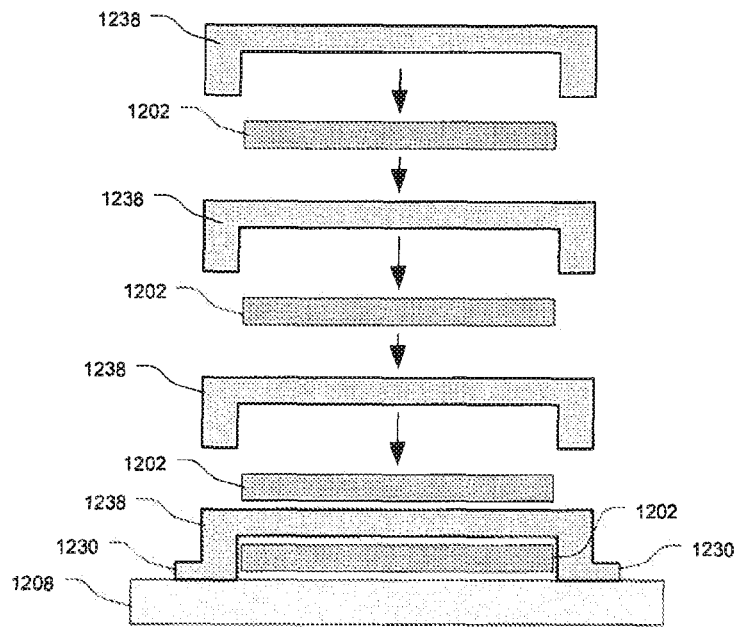
FIG. 14 is an exploded view of the Multi-Chip Package (MCP) with a thermal frame of FIG. 13.
Figure 15:
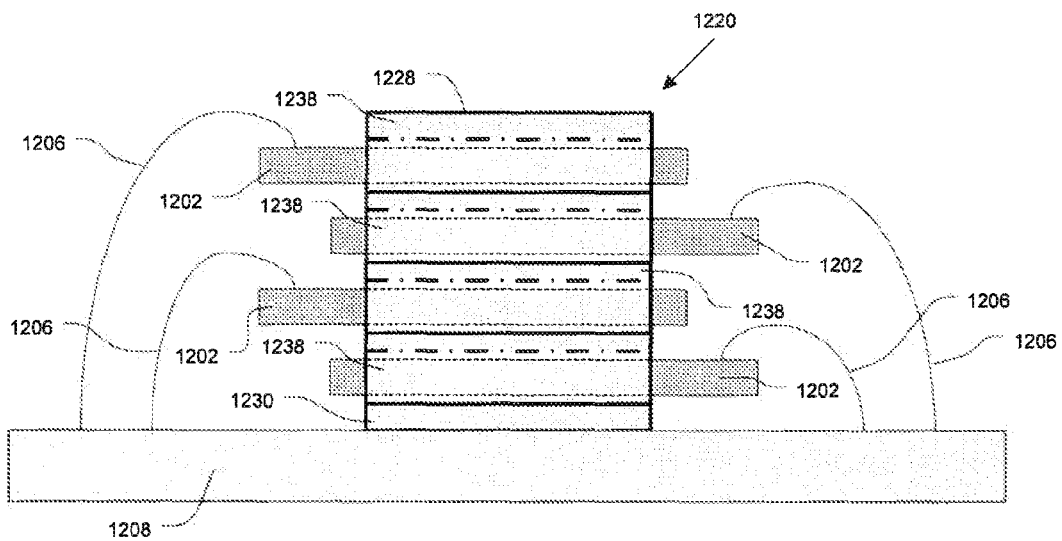
FIG. 15 is a side elevation view of the Multi-Chip Package (MCP) with a thermal frame of FIG. 12.

Referring to FIGS. 12-15, a thermal frame 1220 will be described according to a fourth embodiment. The frame 1220 is similar in some respects to the frames of previously described embodiments, and some of the common features have been given similar reference numbers and will not be described again in detail. This embodiment differs from the embodiment of FIGS. 8-11 in that the channel-shaped members 1238 are of similar or equal width, such that the lateral portion of each channel-shaped member 1238 is supported by the lateral portion of a lower channel-shaped member 1238, to collectively form a lateral portion 1226 of the thermal frame 1220. The uppermost member 1238 forms the top portion 1228. This embodiment is assembled by sequential stacking of dice 1202 and channel-shaped members 1238 such that at least one die 1202 is received in the recess of each channel-shaped member 1238, similarly to previously-described embodiments, as shown in FIG. 14. If two or more adjacent dice 1202 are received in the same channel-shaped member 1238, they may be interconnected using bumps or vias (not shown). An optional bottom member 1229 (FIG. 12) and/or optional bonding tabs 1230 (FIG. 13) may be provided. Each member 1238 may be bonded to any adjacent members 1238 by any suitable means, such as welding or with a suitable adhesive such as a dielectric resin. Referring to FIG. 15, as with the other embodiments, each die 1202 protrudes outwardly from the thermal frame in at least one direction along at least one bonding edge, to allow wire bonding to the substrate 1208 via bonding wires 1206. It should be understood that the present embodiment may be formed using identical channel-shaped members 1238, with only the bottom member 1238, 1229 optionally being a different shape, thereby simplifying the manufacturing process. It is contemplated that the channel-shaped 1238 members may be inverted, so that their channel-shaped recesses are oriented away from the substrate 1208, in which case a cap member (not shown) may optionally be used on the top of the stack.

Figure 16:
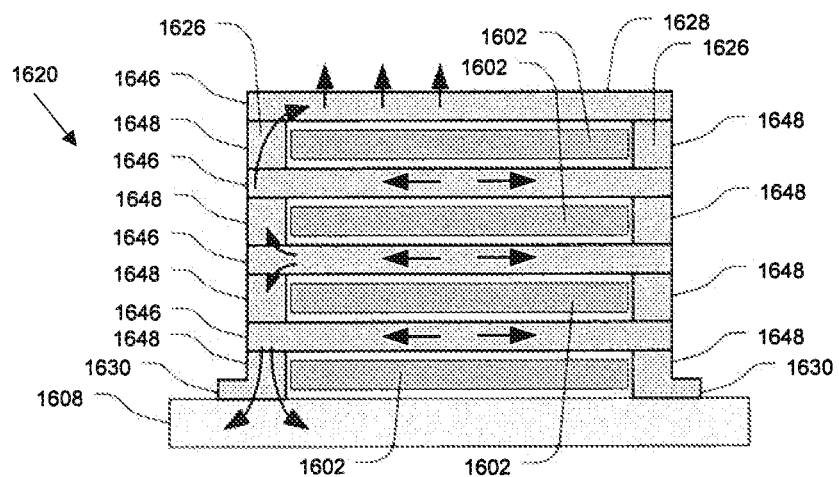
FIG. 16 is a schematic cross-sectional view of a Multi-Chip Package (MCP) with a thermal frame according to a fifth embodiment.
Figure 17:
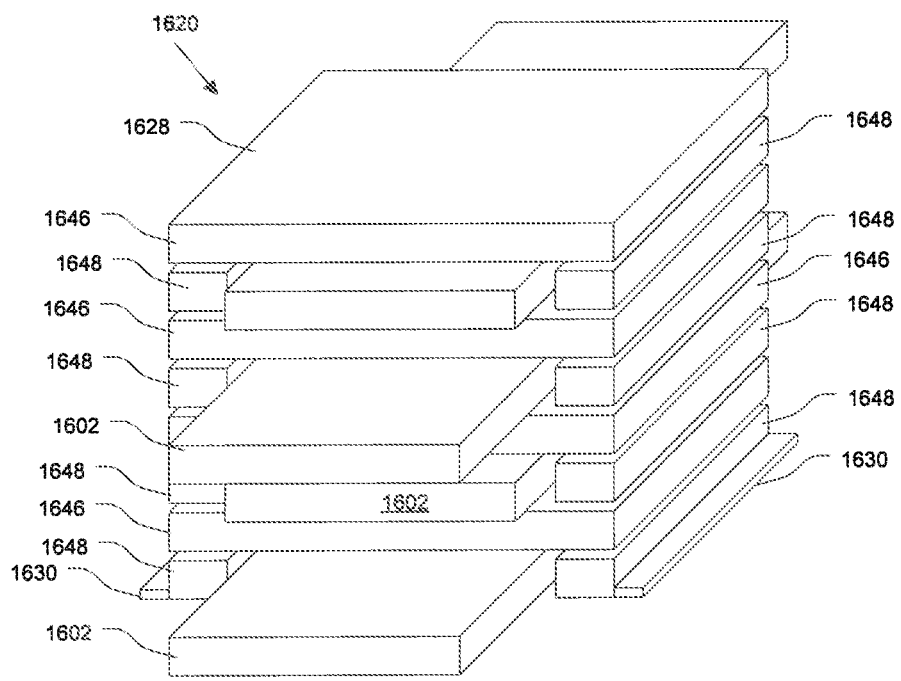
FIG. 17 is a perspective view of the Multi-Chip Package (MCP) with a thermal frame of FIG. 16.
Figure 18:
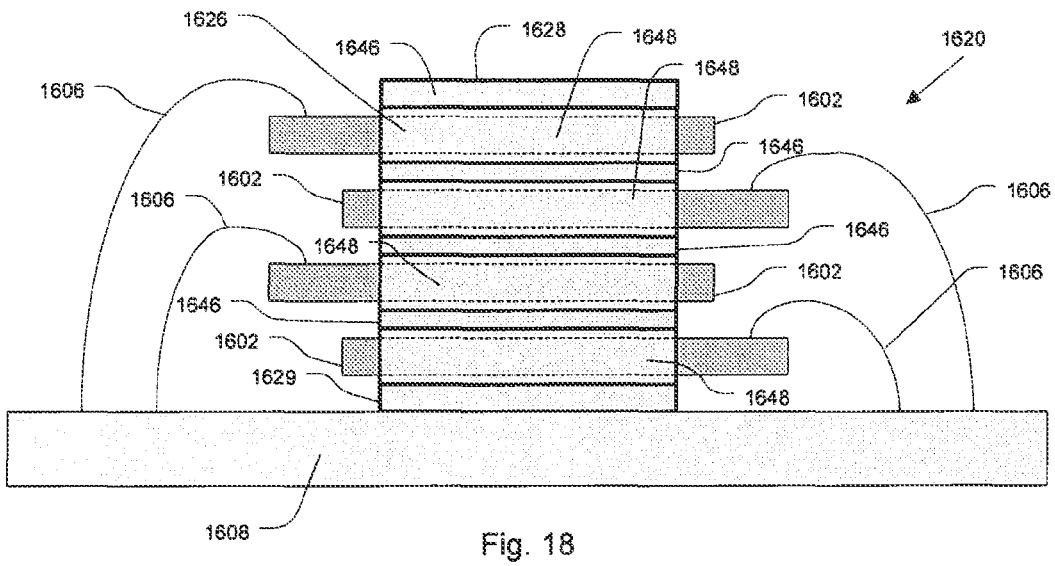
FIG. 18 is a side elevation view of the Multi-Chip Package (MCP) with a thermal frame of FIG. 16.

Referring to FIGS. 16-18, a thermal frame 1620 will be described according to a fifth embodiment. The frame 1620 is similar in some respects to the frames of previously described embodiments, and some of the common features have been given similar reference numbers and will not be described again in detail. In this embodiment, the thermal frame 1620 is formed by a number of plates 1646 in between the semiconductor dice 1602, with strips 1648 disposed laterally of the dice 1602 to interconnect the plates 1646 and together form the lateral portions 1626. The strips 1648 may be dimensioned to accommodate one or more dice 1602 between each pair of consecutive plates 1646. If two or more adjacent dice 1602 are received between the same pair of consecutive plates 1646, they may be interconnected using bumps or vias (not shown). The uppermost plate 1646 forms the top portion 1628. The various portions of the thermal frame 1620 may be bonded in any suitable way, for example by using a thermally-conductive dielectric resin or by welding. Bonding tabs 1630 (FIGS. 16, 17) or a bottom plate member 1629 (FIG. 18) may optionally be used.

Figure 19:
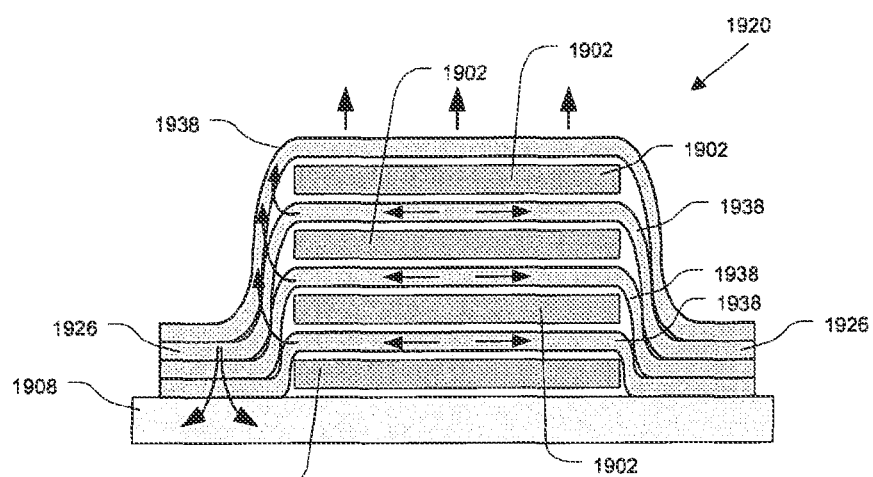
FIG. 19 is a schematic cross-sectional view of a Multi-Chip Package (MCP) with a thermal frame according to a sixth embodiment.
Figure 20:
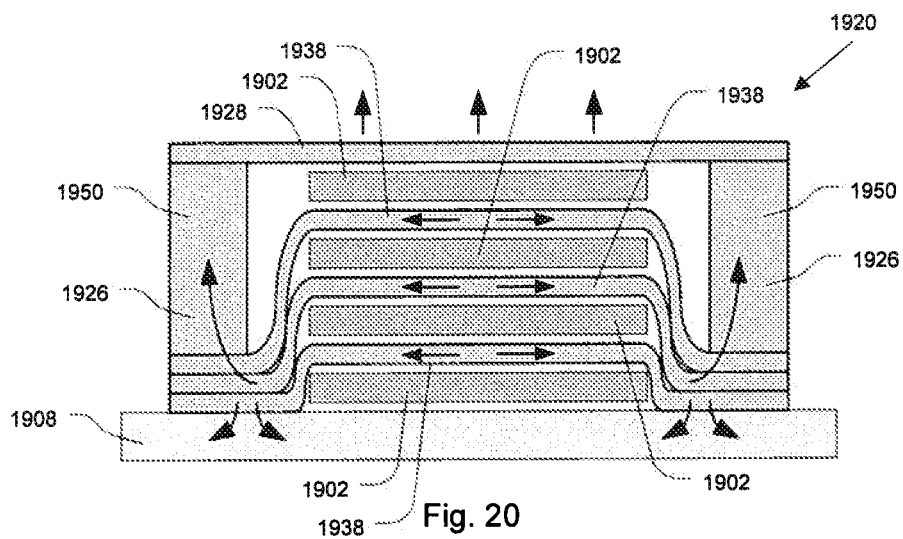
FIG. 20 is a schematic cross-sectional view of the Multi-Chip Package (MCP) with a thermal frame of FIG. 19, according to an alternative embodiment.
Figure 21:
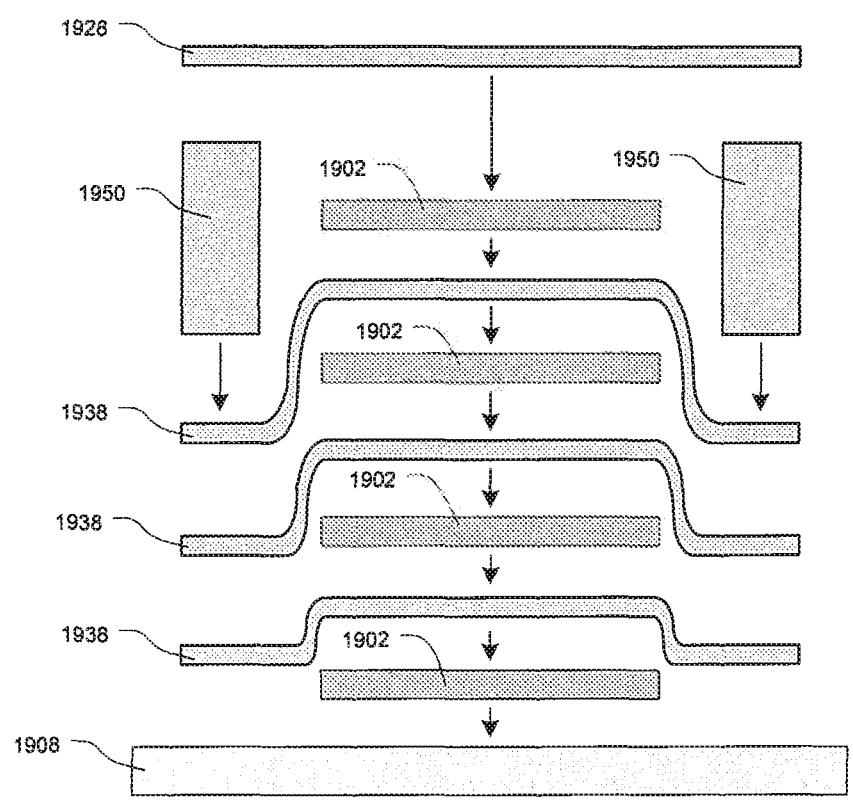
FIG. 21 is an exploded view of the Multi-Chip Package (MCP) with a thermal frame of FIG. 20.

Referring to FIGS. 19-21, a thermal frame 1920 will be described according to a sixth embodiment. The frame 1920 is similar in some respects to the frames of previously described embodiments, and some of the common features have been given similar reference numbers and will not be described again in detail. In this embodiment, the thermal frame 1920 is formed by alternating semiconductor dice 1902 and layers of metal foil 1938. Each layer of foil 1938 may be pre-formed to an appropriate shape prior to stacking, or it may be formed around the die 1902 to a desired shape during the stacking process. The lateral portions of the foil layers 1938 may be joined by any suitable method, such as an adhesive resin or welding, to form a lateral portion 1926 of the thermal frame 1920. A cap member 1928 supported by lateral strips 1950 may be provided instead of or in addition to the uppermost foil layer 1938, for example to provide a flatter or more rigid top or side surface for improved thermal contact with an external heat sink (not shown). The lateral strips 1950 form part of the lateral portion 1926 of the thermal frame 1920 and provide a thermally conductive path between the foil layers 1938 and the cap member 1928. It is contemplated that foil layers 1938 of different thickness may be used, for example to provide thicker layers 1938 near the middle of the stack 1900 or near dice 1902 having higher power consumption, to provide for increased heat dissipation.

Figure 22:
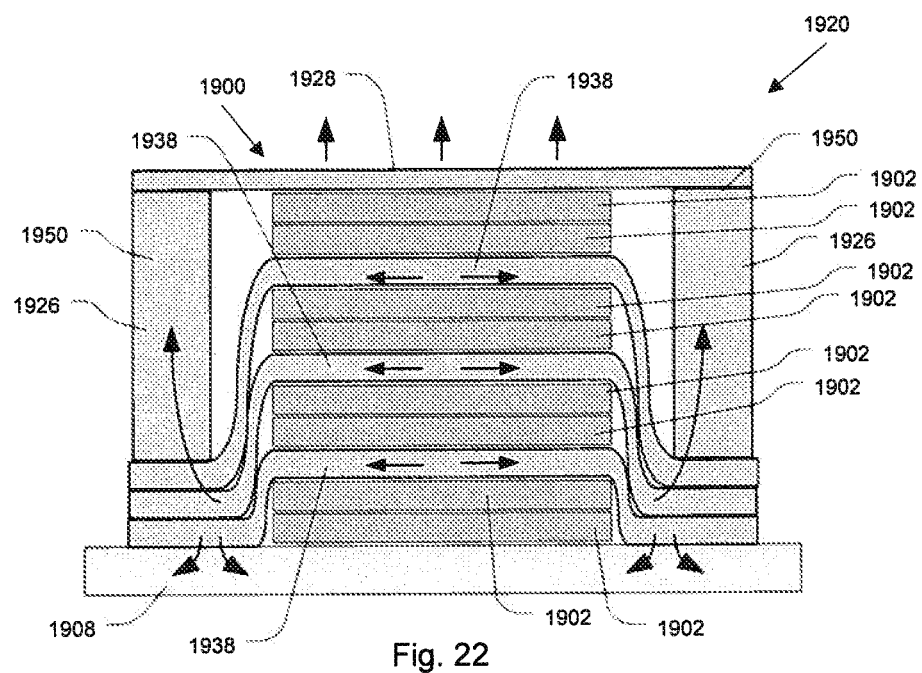
FIG. 22 is a schematic cross-sectional view of a Multi-Chip Package (MCP) with a thermal frame according to an alternative embodiment.

Referring to FIG. 22, the embodiment of FIG. 20 may be modified by having more than one semiconductor die 1902 between consecutive layers 1938 of the thermal frame 1920. In this manner, the overall height of the stack 1900 can be decreased, and adjacent dice 1902 may optionally be connected using bumps or vias (not shown). It is contemplated that a non-uniform number of dice 1902 between consecutive layers 1938 of the thermal frame 1920 may alternatively be used. For example, two or more dice 1902 may be disposed between consecutive layers 1938 of the thermal frame 1920 nearer the top or bottom of the stack 1900, and a single die 1902 may be disposed between consecutive layers 1938 of the thermal frame 1920 nearer the middle of the stack 1900. This arrangement provides increased heat dissipation near the middle of the stack 1900 while maintaining a compact arrangement. It is further contemplated that the other embodiments described above may be modified in a similar manner, by varying the number of dice between consecutive layers of the thermal frame.

Modifications and improvements to the above-described embodiments of the present invention may become apparent to those skilled in the art. The foregoing description is intended to be exemplary rather than limiting.

What is claimed is:

1. A semiconductor device comprising:
    a substrate having a plurality of substrate bonding pads disposed on a bonding surface thereof;
    a plurality of semiconductor dice stacked on the bonding surface of the substrate to form a die stack, each die having a plurality of die bonding pads arranged along at least one bonding edge thereof, the remaining edges of each die being non-bonding edges;
    a plurality of bonding wires, each bonding wire electrically connecting one of the die bonding pads to one of the substrate bonding pads;
    at least one thermally conductive layer, each thermally conductive layer being disposed between two adjacent semiconductor dice; and
    at least one thermally conductive lateral portion in thermal contact with the at least one thermally conductive layer, each thermally conductive lateral portion being arranged along a non-bonding edge of the die stack.

2. The device of claim 1, wherein the thermally conductive layer and the thermally conductive lateral portion are composed primarily of an electrically conductive material, the device further comprising a dielectric layer disposed between the at least one thermally conductive layer and the two adjacent semiconductor dice to provide electrical isolation therebetween.

3. The device of claim 2, wherein the electrically conductive material is one of a metal and a metallic alloy.

4. The device of claim 3, wherein the dielectric layer is a dielectric coating on the thermally conductive layer.

5. The device of claim 1, wherein the substrate is in thermal contact with the at least one lateral portion.

6. The device of claim 1, further comprising a thermally conductive top layer disposed on an uppermost die of the stack, the thermally conductive top layer being in thermal contact with the at least one lateral portion.

7. The device of claim 6, wherein the top layer comprises a heat sink portion for dissipating heat generated by the device during operation.

8. The device of claim 1, wherein the substrate is in thermal contact with the at least one lateral portion, the substrate further comprising a heat sink portion for dissipating heat generated by the device during operation.

9. The device of claim 1, wherein the at least one thermally conductive layer is a plurality of thermally conductive layers.

10. The device of claim 9, wherein each die is adjacent to a thermally conductive layer.

11. The device of claim 10, wherein every pair of adjacent dice has a thermally conductive layer disposed therebetween.

12. The device of claim 9, wherein: a first one of the plurality of thermally conductive layers is thicker than a second one of the plurality of thermally conductive layers.

13. The device of claim 12, wherein: the first one of the plurality of thermally conductive layers is closer to a center of the stack than the second one of the plurality of thermally conductive layers.

14. The device of claim 9, wherein: each of the thermally conductive layers has at least one end portion extending beyond a non-bonding edge of the dice; and each lateral portion is formed at least in part by at least one end portion of the thermally conductive layers.

15. The device of claim 14, wherein: each lateral portion includes a thermally conductive resin disposed between the end portions of the thermally conductive layers.

16. The device of claim 14, wherein: each lateral portion is assembled at least in part by welding the end portions of the thermally conductive layers.

* * * * *